United States Patent

Hayashi

(10) Patent No.: US 7,145,666 B2
(45) Date of Patent: Dec. 5, 2006

(54) POSITION DETECTING METHOD AND APPARATUS

(75) Inventor: Nozomu Hayashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 423 days.

(21) Appl. No.: 10/770,420

(22) Filed: Feb. 4, 2004

(65) Prior Publication Data

US 2004/0204901 A1   Oct. 14, 2004

(30) Foreign Application Priority Data

Feb. 6, 2003   (JP)   ............................. 2003-029674

(51) Int. Cl.
*G01B 11/00*   (2006.01)
(52) U.S. Cl. ..................... 356/614; 356/401
(58) Field of Classification Search ........ 356/601–623, 356/399–401, 394; 355/53, 69, 77; 250/548, 250/559.22, 559.31, 559.38
See application file for complete search history.

(56) References Cited

U.S. PATENT DOCUMENTS

| | | | | |
|---|---|---|---|---|
| 5,231,471 A | * | 7/1993 | Torigoe | ....................... 356/401 |
| 5,585,925 A | * | 12/1996 | Sato et al. | ................... 356/401 |
| 5,986,766 A | * | 11/1999 | Koga et al. | .................. 356/401 |
| 6,091,481 A | * | 7/2000 | Mori | ............................ 355/67 |
| 6,333,786 B1 | * | 12/2001 | Uzawa et al. | ................ 356/401 |
| 6,844,918 B1 | * | 1/2005 | Navarro Y Koren et al. | . 355/53 |
| 2003/0053040 A1 | | 3/2003 | Hayashi et al. | ................ 355/55 |
| 2005/0270509 A1 | * | 12/2005 | Ogushi et al. | ................. 355/55 |
| 2006/0092420 A1 | * | 5/2006 | Oishi | .......................... 356/401 |

FOREIGN PATENT DOCUMENTS

| JP | 3-282715 | 12/1991 |
|---|---|---|
| JP | 10-284406 | 10/1998 |

* cited by examiner

*Primary Examiner*—Hoa Q. Pham
(74) *Attorney, Agent, or Firm*—Fitzpatrick, Cella, Harper & Scinto

(57) ABSTRACT

A position detecting method including steps of sensing an image of first and second marks, orthogonally transforming a signal obtained in the sensing step, and calculating each position of the first and second marks based on a phase of a corresponding frequency component obtained in the transform step. Patterns are disposed at a first interval in the first mark, patterns are disposed at a second interval in the second mark, and one of the first and second intervals is not an integer multiple of the other of the first and second intervals.

8 Claims, 9 Drawing Sheets

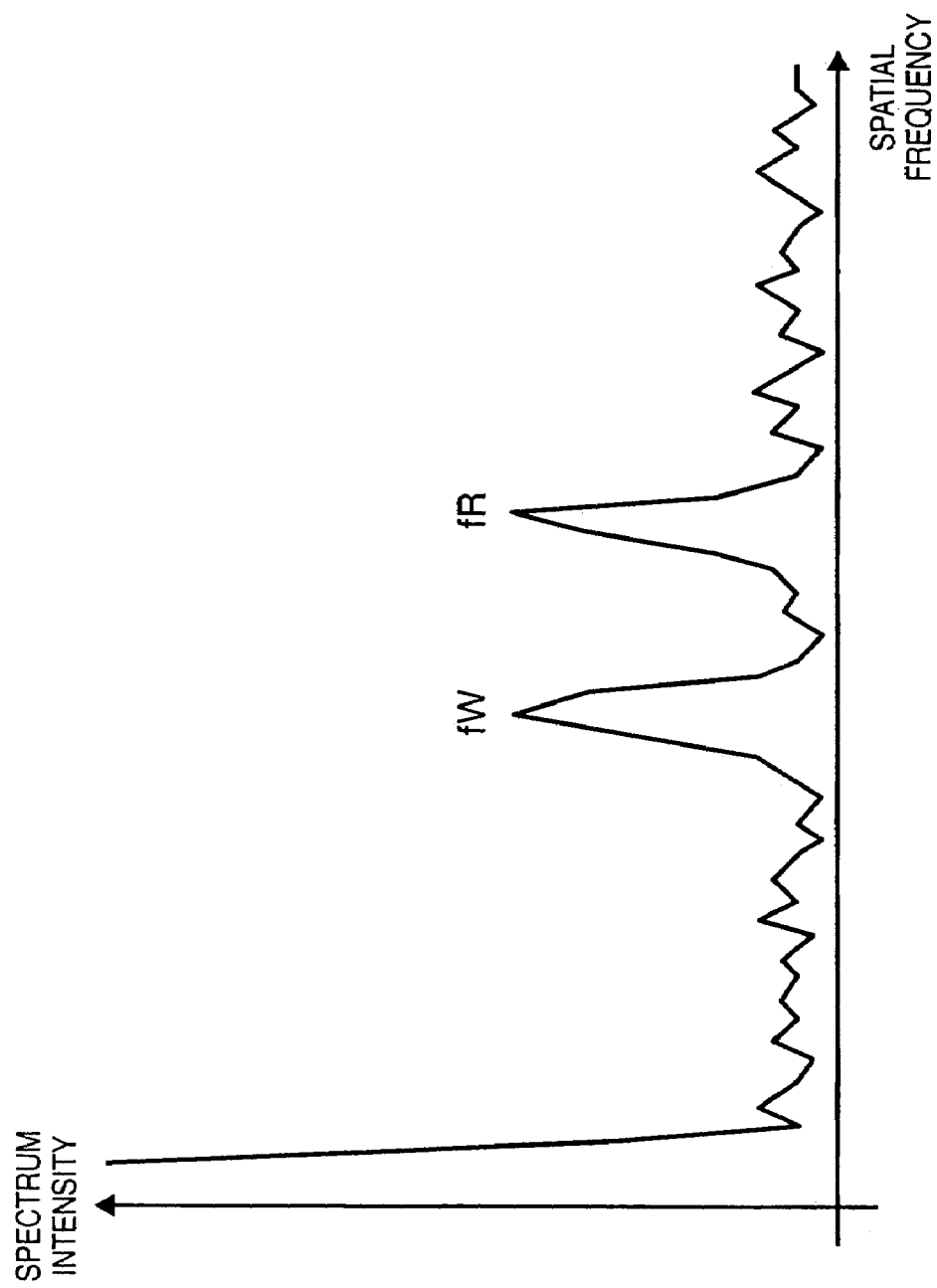

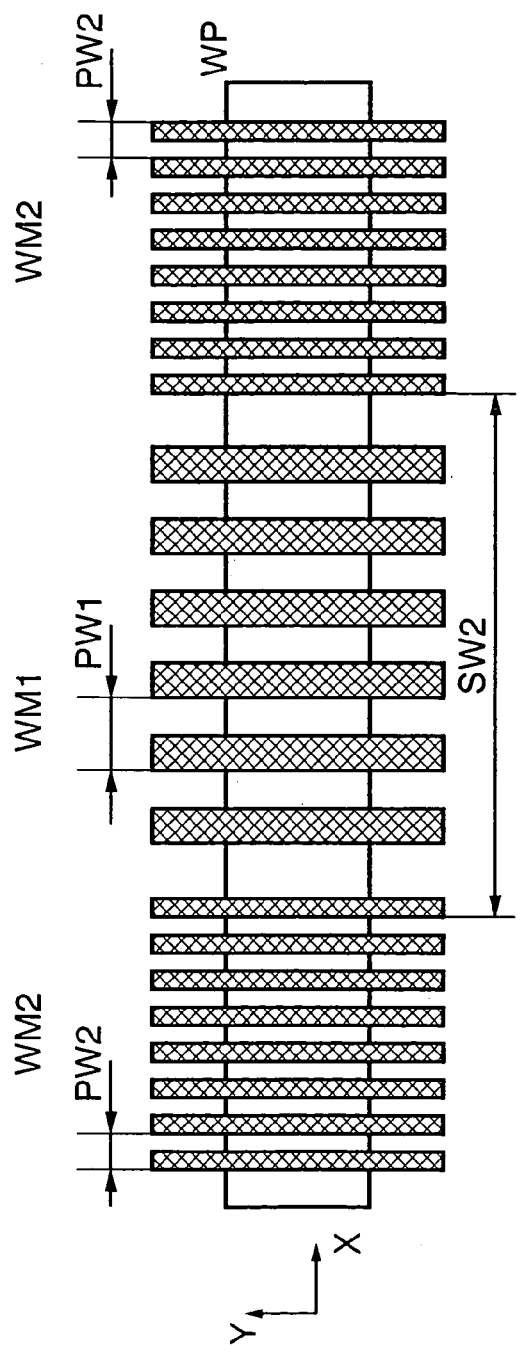
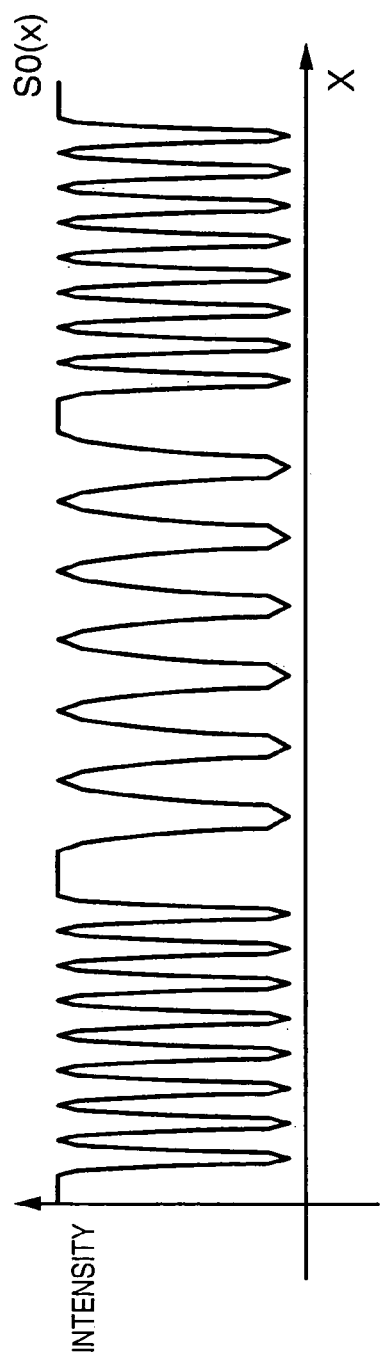
FIG. 6A
FIG. 6B

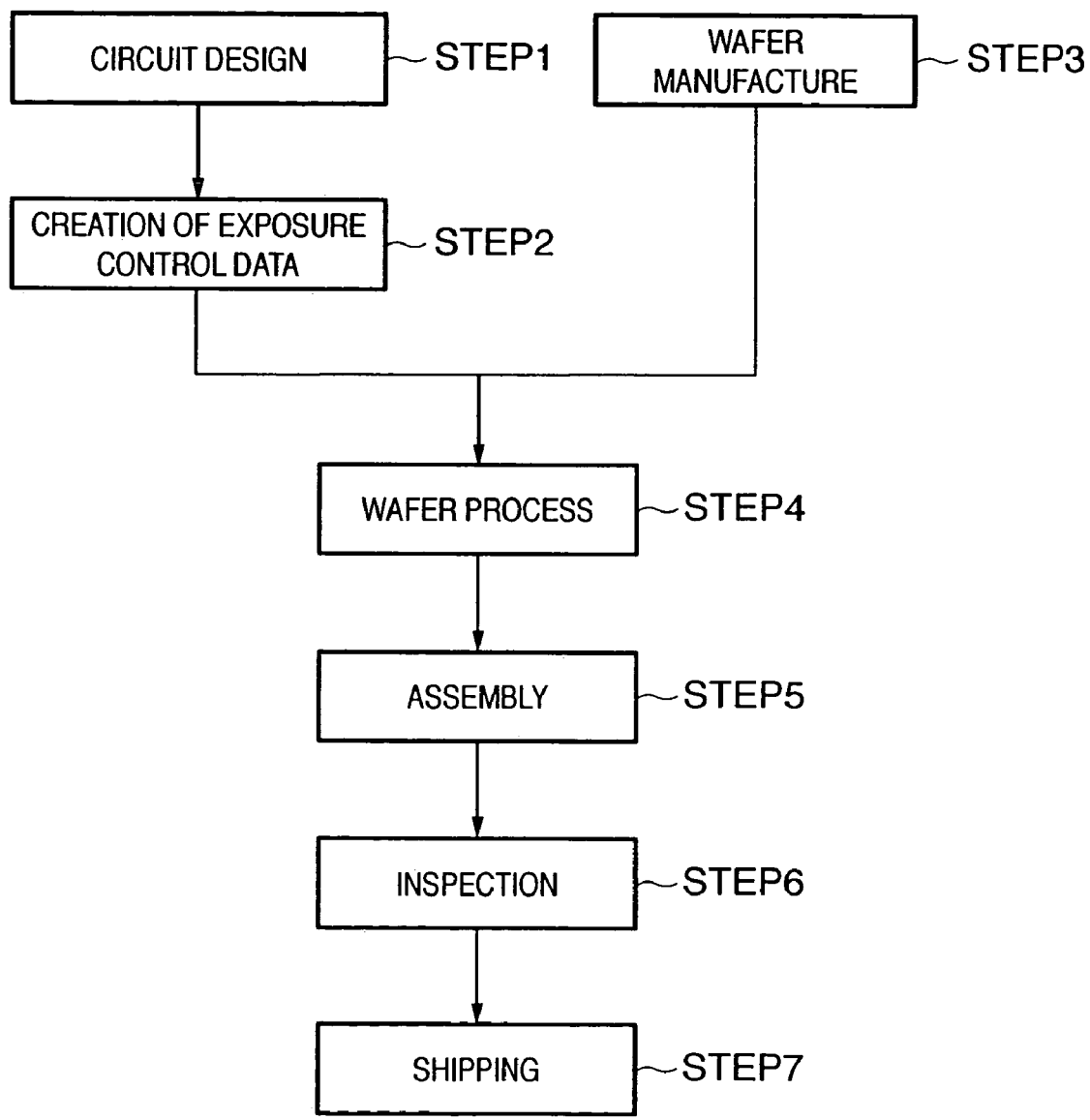

POSITION DETECTING METHOD AND APPARATUS

FIELD OF THE INVENTION

This invention relates to a position detecting technique for detecting a position of a mark.

BACKGROUND OF THE INVENTION

A mark imaging method in an ordinary exposure apparatus for manufacturing semiconductors will be described with reference to FIG. 7. Shown in FIG. 7 are a reticle R, a wafer W that is a substrate to be exposed, a projection optical system 1 in which the optical axis is the z axis, an optical system S for imaging marks that are to be observed, an illumination unit 2 for imaging the marks, a beam splitter 3, optical systems 4 and 5 for forming an image, an image sensing unit 6, an A/D converter 7, an integrating unit 8, an image processing unit 9, a stage driving unit 10, a stage 11 that is movable in three dimensions, and a position measuring unit 12, such as an interferometer, for measuring stage position.

Mark imaging in the exposure apparatus having the above-described structure is performed through the following procedure. First, the reticle R is moved by a reticle-stage moving unit (not shown) to a position at which a reticle mark RM can be observed. Similarly, the stage 11 is moved to a position at which it is possible to observe an observation mark WM on the wafer W. Initially, the wafer mark WM is illuminated by light flux, which is emitted by the illumination unit 2, via the beam splitter 3, reticle mark RM and projection optical system 1. Light flux reflected from the wafer mark WM reaches the beam splitter 3 again via the projection optical system 1 and reticle R. The light flux that has arrived from the projection optical system 1 is reflected by the beam splitter 3 and forms an image RM of the reticle mark and an image WM of the wafer mark on the image sensing surface of the image sensing unit 6 via the image forming optical system 5.

FIG. 2A illustrates an example of the observation marks whose images have been formed on the image sensing surface in the above description. The reticle mark RM and the wafer mark WM each comprise a plurality of identically shaped patterns. The reticle mark and the wafer mark have a mark pitch equivalent to a certain fundamental spatial frequency. The image sensing unit 6 converts the images of the marks formed on the image sensing surface into electrical signals (photoelectric conversion). The A/D converter 7 subsequently converts the output of the image sensing unit 6 to a two-dimensional digital signal sequence.

The integrating unit 8 in FIG. 7 executes integration processing along the direction Y of an area WP of the kind shown in FIG. 2A and converts the two-dimensional signal to a one-dimensional digital sequence $S0(x)$, as shown in FIG. 2B. On the basis of the digital signal sequence $S0(x)$ obtained by the conversion, the image processing unit 9 uses means, such as pattern matching or calculation of a center of gravity to measure the center positions of the reticle and wafer marks and to measure their relative positions.

The above-described method of detecting a mark position is one that is extremely useful in a position detecting apparatus that requires accurate detection of the mark position. In the above example of the prior art, however, the signal is a discrete sequence owing to the A/D conversion for the purpose of processing the electrical signal and, hence, the detected mark positions also are discrete values. The influence of this can no longer be neglected as the need for greater position detection accuracy grows.

To deal with this, the specifications of Japanese Patent Application Laid-Open Nos. 3-282715 and 10-284406 disclose techniques for converting discrete sequence signals to signals in a spatial frequency domain by an orthogonal transform and measurement mark position based upon the phase of a mark-specific spatial frequency component, thereby making it possible to detect position from discrete sequence signals in a highly accurate fashion.

However, in a case wherein the art disclosed in the specifications of Japanese Patent Application Laid-Open Nos. 3-282715 and 10-284406 is utilized, position must be measured mark by mark in order to measure the positions of both the reticle mark RM and wafer mark WM. In other words, a processing window must be set separately at the two areas of reticle mark RM and wafer mark WM, and the orthogonal transform, which places a burden on processing, must be performed twice. The problem that arises is a decline in throughput.

SUMMARY OF THE INVENTION

An object of the present invention is to realize a reduction in time for mark position detection that uses an orthogonal transform.

According to one aspect of the present invention, there is provided a position detecting method comprising steps of sensing an image of first and second marks, orthogonally transforming a signal obtained in the sensing step, and calculating each position of the first and second marks based on a phase of a corresponding frequency component obtained in the transform step.

Further, according to another aspect of the present invention, there is provided a position detecting apparatus comprising a sensing unit which senses an image of first and second marks, a transform unit which orthogonally transforms a signal obtained by the sensing unit, and a calculation unit which calculates each position of the first and second marks based on a phase of a corresponding frequency component obtained by the transform unit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a diagram illustrating a spatial frequency domain obtained by orthogonally transforming the periodic pattern signal waveform shown in FIG. 3A;

FIGS. 6A and 6B are diagrams illustrating an example of images of observation marks on an image sensing surface and a periodic pattern signal obtained as a result of these observation marks, respectively, in a third embodiment of the present invention;

FIG. 9 is a diagram useful in describing the flow of device manufacture.

DESCRIPTION OF THE PREFERRED EMBODIMENTS

Preferred embodiments of the present invention will now be described in detail in accordance with the accompanying drawings.

First Embodiment

Figure 1:
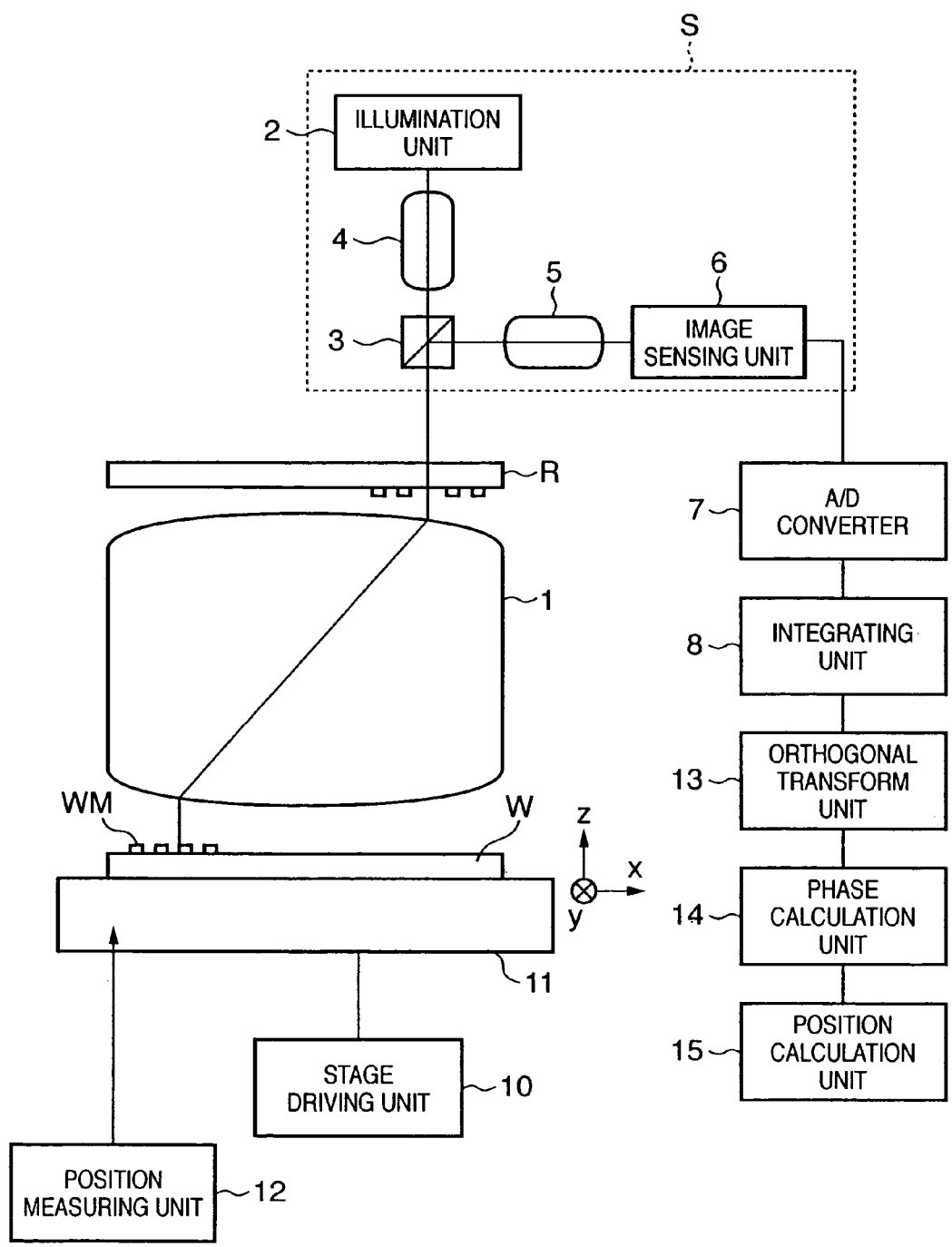
FIG. 1 is a block diagram for describing the positioning-related structure of an exposure apparatus for manufacturing semiconductors according to a first embodiment of the present invention.
Figure 2A:
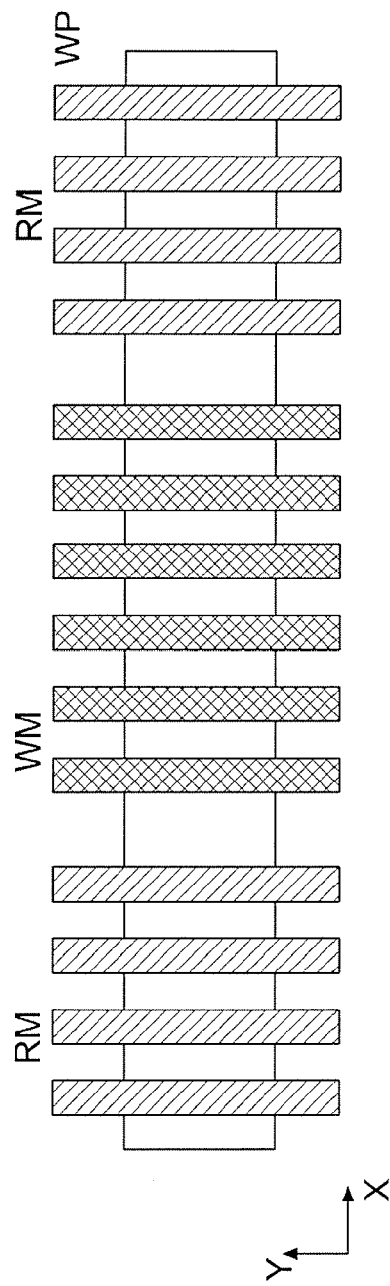
FIGS. 2A and 2B are diagrams illustrating a general example of images of observation marks on an image sensing surface and a periodic pattern signal obtained as a result of these observation marks, respectively.
Figure 2B:
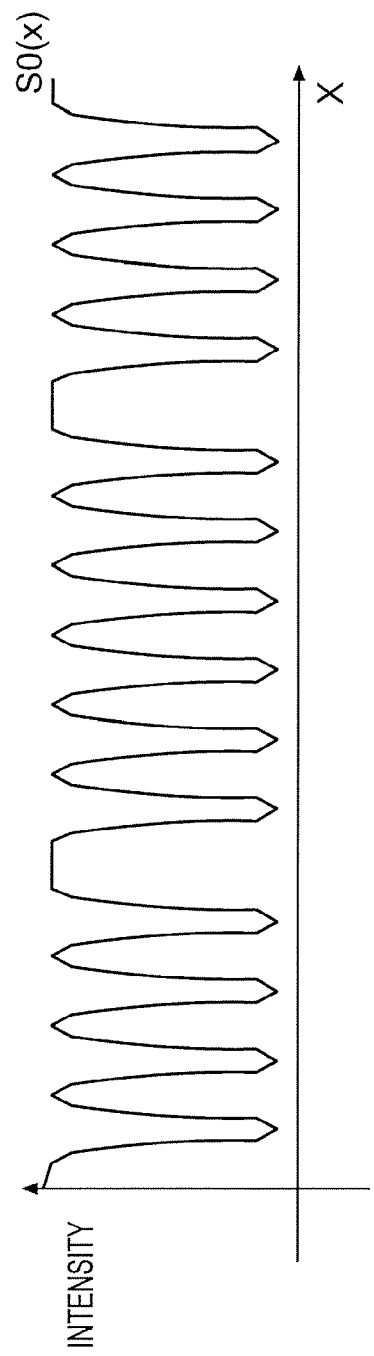

An example in which positioning according to the present invention is applied to an exposure apparatus for semiconductor manufacture is illustrated below. Shown in FIG. 1 are the reticle R, the wafer W that is the substrate to be exposed, the projection optical system 1 in which the optical axis is the z axis, the optical system S for imaging marks to be observed, the illumination unit 2 for imaging the marks, the beam splitter 3, the optical systems 4 and 5 for forming an image, the image sensing unit 6, the A/D converter 7, the integrating unit 8, the image processing unit 9, the stage driving unit 10, the stage 11, which is movable in three dimensions, the position measuring unit 12, such as an interferometer, for the position of the stage 11, an orthogonal transform unit 13, a phase calculation unit 14 and a position calculation unit 15. The procedure for mark imaging and position measurement by the positioning arrangement of this embodiment constructed as set forth above will now be described.

First, the reticle R is moved by a reticle-stage moving unit (not shown) to a position at which the reticle mark RM can be observed. Similarly, the stage 11 is moved to a position at which it is possible to observe the observation mark WM on the wafer W.

Next, light flux for illuminating the observation marks is emitted by the illumination unit 2. It should be noted that the illumination unit 2 may just as well serve as an illumination unit for measuring a focal point. The light flux emitted from illumination unit 2 illuminates the wafer mark WM via the beam splitter 3, reticle mark RM and projection optical system 1. Light flux reflected from the wafer mark WM reaches the beam splitter 3 again via the projection optical system 1 and reticle R. The light flux that has arrived is reflected by the beam splitter 3 and forms the image RM of the reticle mark and the image WM of the wafer mark on the image sensing surface of the image sensing unit 6 via the image forming optical system 5.

Figure 3A:
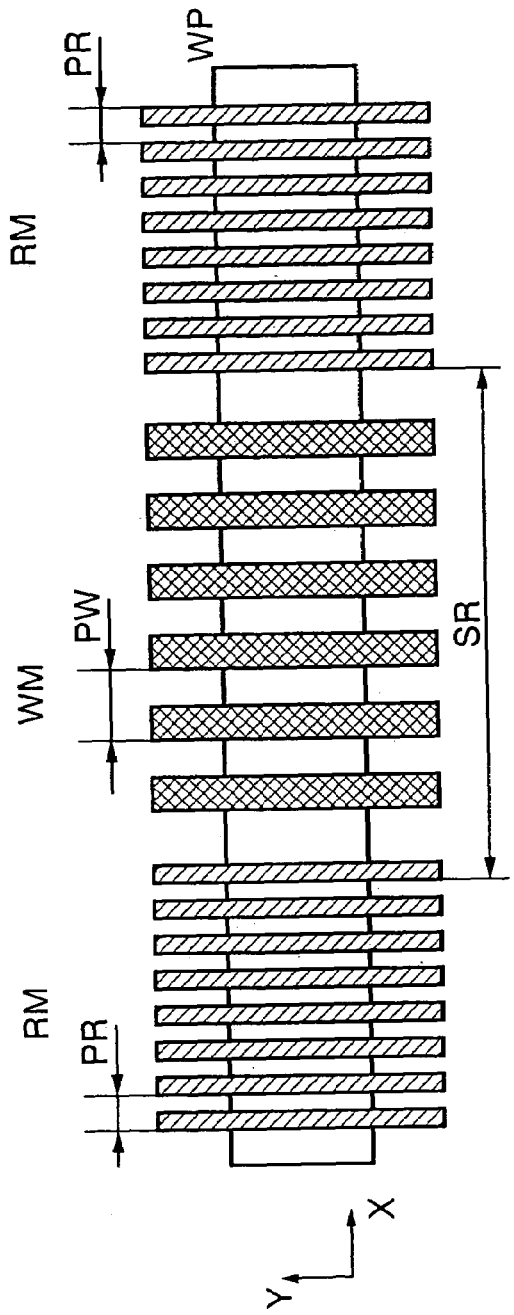
FIGS. 3A and 3B are diagrams illustrating an example of images of observation marks on an image sensing surface and a periodic pattern signal obtained as a result of these observation marks, respectively, in the first embodiment.

FIG. 3A illustrates an example of images of the observation marks on the image sensing surface. The reticle mark RM and the wafer mark WM each comprise a plurality of identically shaped patterns. In FIG. 3A, the image of wafer mark WM is arranged to fall between the images of reticle marks RM, though an arrangement in which the reticle mark RM falls between the wafer marks WM may be adopted. However, it should be noted that the image of the reticle mark RM is disposed on the image sensing surface with a line width and pitch that differ from those of the wafer marks WM on the image sensing surface. Pitch PR of the reticle mark and pitch PW of the wafer mark are related by the equation PW≠mPR (where m is an arbitrary integer). Further, in a case wherein processing is executed upon inserting the wafer mark WM between the reticle marks, as shown in FIG. 3A, a span SR of the reticle marks RM bracketing the wafer mark WM is expressed by the equation SR=nSR (where n is an arbitrary integer). (It should be noted that in a case wherein a mark is not inserted between marks, positioning is performed in such a manner that the mark positions obtained will be spaced apart a prescribed distance rather than be made to coincide.)

Figure 3B:
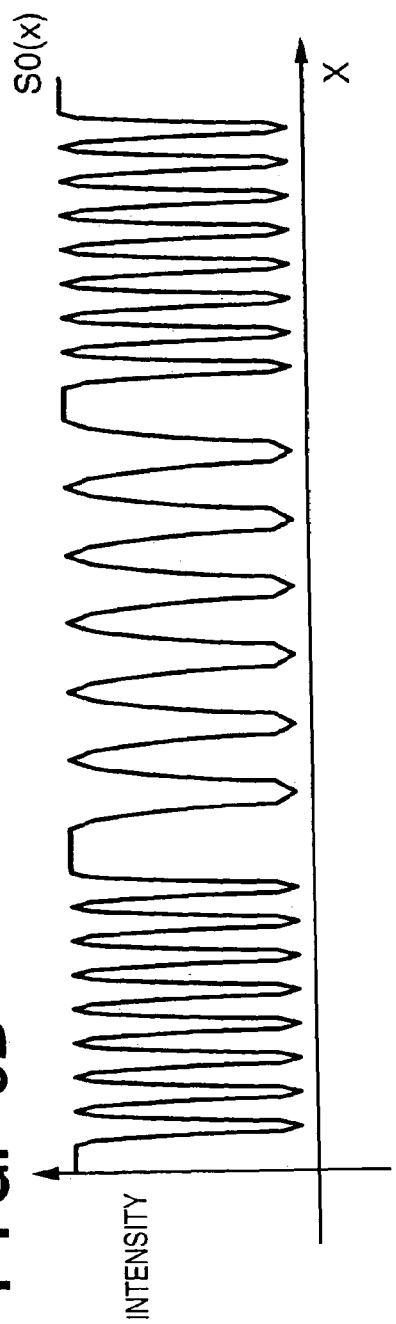

The group of marks described above is imaged and subjected to photoelectric conversion by the image sensing unit 6. The A/D converter 7 subsequently converts the output of the image sensing unit 6 to a two-dimensional digital signal sequence. The integrating unit 8 in FIG. 1 executes integration processing along the direction Y of the area WP of the kind shown in FIG. 3A and converts the two-dimensional signal to a one-dimensional digital signal sequence S0(x), as shown in FIG. 3B. The mark positions are then calculated by processing the digital signal sequence, which has been obtained by the conversion, by the method set forth in the specifications of Japanese Patent Application Laid-Open Nos. 3-282715 and 10-284406.

A case wherein the mark-position calculation method disclosed in the specification of Japanese Patent Application Laid-Open No. 10-284406 is applied will now be described.

Figure 8:
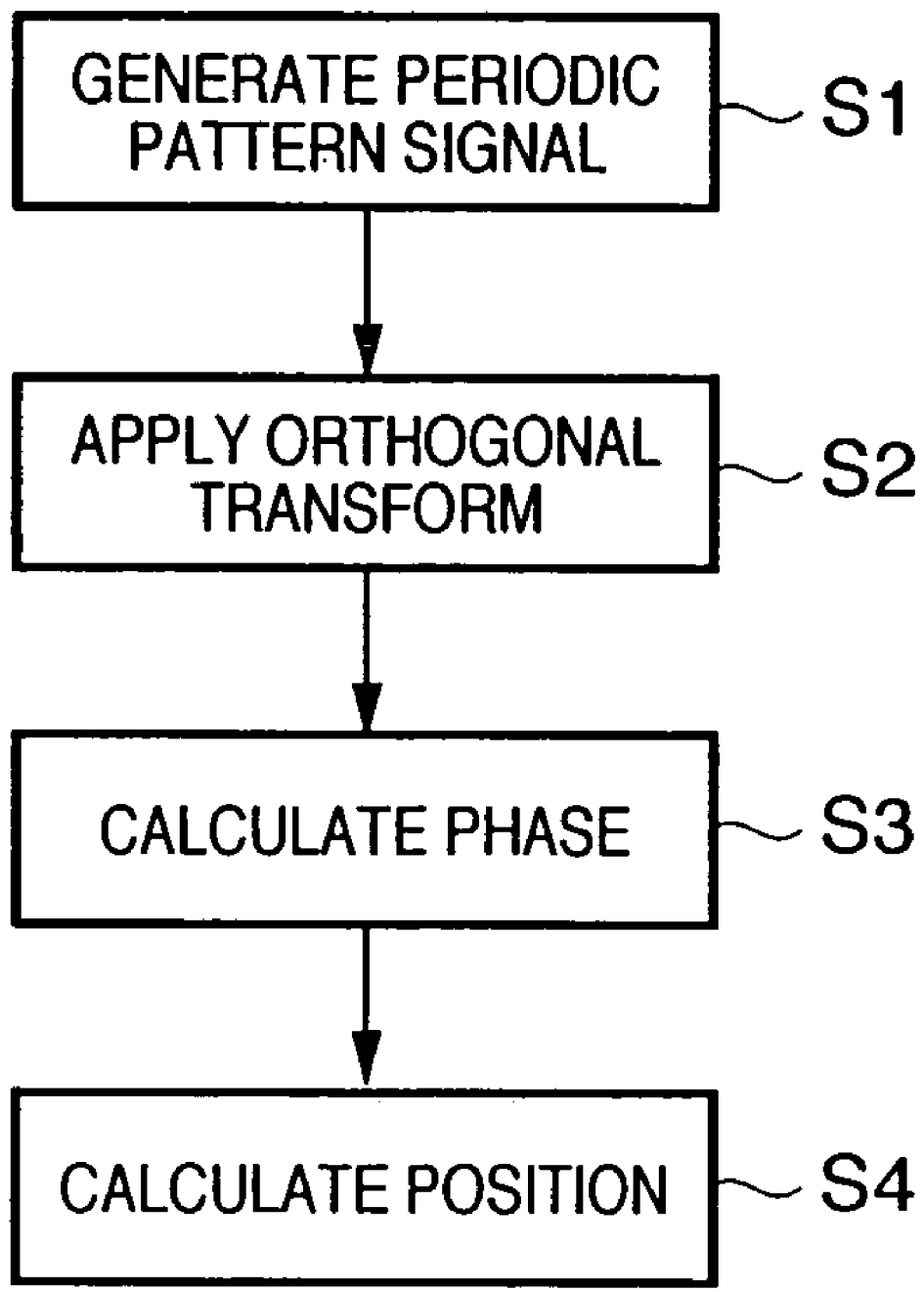
FIG. 8 is a flowchart for describing the procedure of signal processing according to the first embodiment.

FIG. 8 is a flowchart for describing the procedure of signal processing according to this embodiment. In FIG. 8, a periodic pattern is generated at step S1. More specifically, a one-dimensional discrete signal sequence having a periodicity of the kind shown in FIG. 3B is generated by the integrating unit 8 and supplied to the orthogonal transform unit 13.

Next, at step S2, the orthogonal transform unit 13 applies orthogonal transform processing to the signal that enters from the integrating unit 8. Here, a well-known orthogonal transform, such as a discrete Fourier transform is applied to the input signal to convert the signal to a spatial frequency domain. For example, in a case wherein a discrete Fourier transform is used as the orthogonal transform, values in the spatial frequency domain can be obtained by the following transformation formulae:

$$Xr(f) = \sum_{n=-N/2}^{n=N/2} x(xo+n)\cos(-2\pi nf/N) \quad (1)$$

$$Xi(f) = \sum_{n=-N/2}^{n=N/2} x(xo+n)\sin(-2\pi nf/N) \quad (2)$$

In Equations (1) and (2) above, x represents an input signal sequence, Xr the real-number part of a spatial frequency component, Xi the imaginary-part of a spatial frequency component, N the processing width of the discrete Fourier transform, xo a position at which phase is detected at the center of the processing range of the discrete Fourier transform, and f a frequency of interest, which is the frequency of the spatial frequency component sought.

In the orthogonal transform, the values at all frequencies are obtained and the frequency for which power is maximized is selected. FIG. 4 illustrates the spectrum distribution after the application of the orthogonal transform. Since the pitch of the reticle mark RM and that of the wafer mark WM differ, the distribution has peaks at spatial frequencies fR, fW that differ from each other. The phases of the spatial frequencies fR, fW corresponding to the peaks are obtained by the phase calculation unit 14 at a step S3 and the mark positions are calculated by the position calculation unit 15 at step S4.

First, the phase calculation unit 14 uses the following well-known Equation (3) to calculate the phase θ of a spatial frequency component for which a pattern to be detected in the spatial frequency domain appears uniquely:

$$\theta = \arctan\left(\frac{Xi(f)}{Xr(f)}\right). \quad (3)$$

Here, the phase θ is obtained with regard to a case wherein f is fR with regard to a case wherein f is fW.

Next, the position calculation unit 15 uses Equation (4) below to calculate mark position d from the phase θ obtained by the phase calculation unit 14. It should be noted that the two mark positions, namely, the reticle mark position and wafer mark position, are calculated in association with the two phases obtained by the phase calculation unit 14.

$$d = xo + \left(\frac{\theta N}{\pi f}\right) \quad (4)$$

This equation is the result of adding the amount of phase advance obtained when the periodic pattern signal advances by the amount of the phase θ to xo. Accordingly, the relative positions between the two marks, namely, the reticle mark RM and the wafer mark WM, can be detected and the positioning of the reticle and wafer can be carried based upon the results of the detection.

Thus, in accordance with the first embodiment as described above, the reticle mark RM and the wafer mark WM are disposed at mutually different line widths and pitches, it is so arranged that the pitch PR of the reticle mark and pitch PW of the wafer mark will satisfy the inequality PW≠mPR (where m is an arbitrary integer), and the discrete sequence signal is orthogonally transformed, whereby the fundamental spatial frequency component of each mark can be obtained by executing orthogonal transform processing a single time and the position of each mark can be found accurately from the phase of the fundamental spatial frequency component corresponding to each mark. In other words, the relative positions of the reticle mark RM and the wafer mark WM can be obtained by executing orthogonal transform processing a single time. As a result, highly precise detection of position is possible and the problem relating to throughput does not arise.

Further, in accordance with the above-described technique, mark position is detected by taking note of the periodicity of the signal sequence. As a result, there is little susceptibility to effects of noise that may be contained in the signal.

Signal Embodiment

A second embodiment relating to positioning of a wafer and a reticle in an exposure apparatus for semiconductor manufacture is illustrated below. In the first embodiment, position is detected from marks arrayed in one dimension and, therefore, position can only be calculated in one direction from one mark. In the second embodiment, it is so arranged that position detecting corresponding to two directions can be performed using a single mark. It should be noted that the structure of the apparatus relating to positioning is similar to that of the first embodiment (see FIG. 1) and need not be illustrated and described again.

Figure 5:
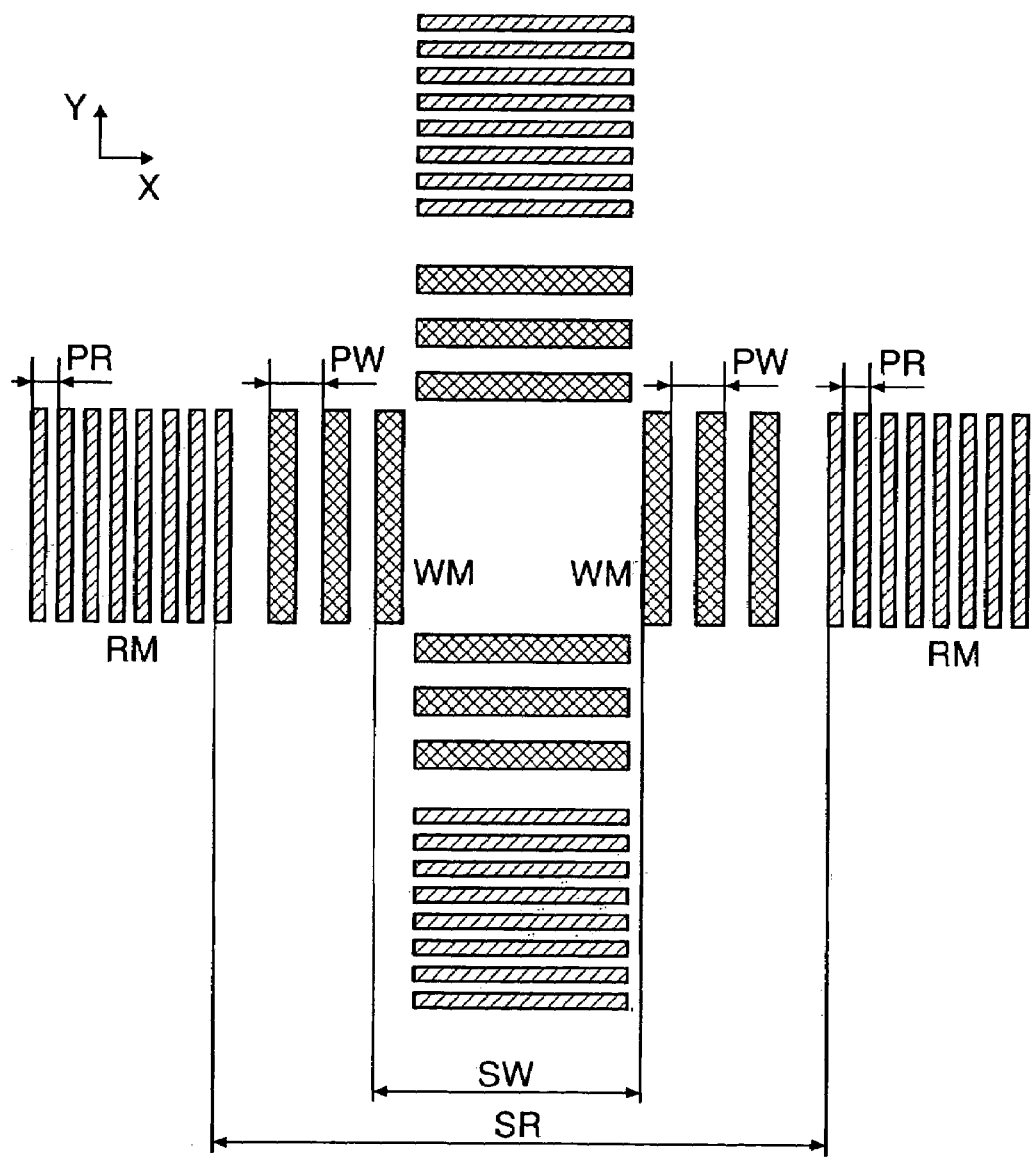
FIG. 5 is a diagram illustrating an example of images of observation marks on an image sensing surface according to a second embodiment of the invention.
Figure 7:
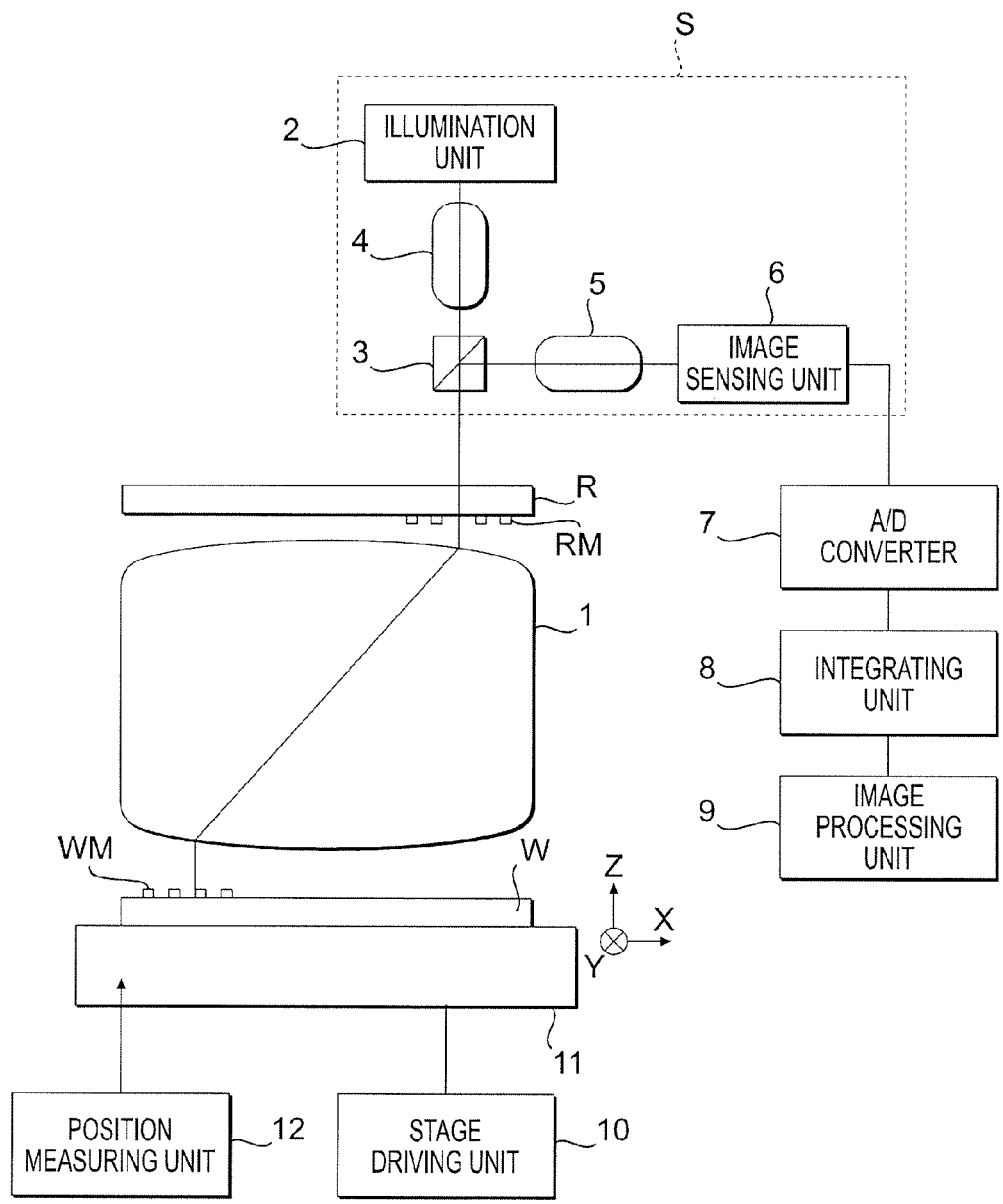
FIG. 7 is a block diagram for describing the positioning-related structure of a conventional exposure apparatus for manufacturing semiconductors.

FIG. 5 is a diagram illustrating an example of observation marks whose images are formed on the image sensing surface of the image sensing unit 6. The marks employed in the second embodiment are obtained by disposing reticle mark RM composed of a plurality of identically shaped patterns and reticle mark WM composed of a plurality of identically shaped patterns. Furthermore, identically shaped marks are disposed in two mutually orthogonal directions in such a manner that measurement along the x, y directions can be performed from an image obtained by a single image sensing operation.

As shown in FIG. 5, the images of the reticle mark RM and the wafer mark WM are disposed on the image sensing surface at mutually different line widths and pitches, and it is so arranged that the pitch PR of the reticle mark and pitch PW of the wafer mark are related by the equation PW≠mPR (where m is an arbitrary integer). Further, it is so arranged that the span SR of the reticle marks RM is expressed by the equation $SR=n_1 PR$ (where $n_1$ is an arbitrary integer), and it is so arranged that span SW of the wafer marks WM is expressed by the equation $SW=n_2 PW$ (where $n_2$ is an arbitrary integer). Even though the images of the marks thus disposed on the image sensing surface are spaced apart by the respective spans SR, SW, there is no influence upon the orthogonal transform because the phases are equal, and measurement of the mark positions can be performed through a method similar to that described in the first embodiment.

Third Embodiment

A third embodiment relating to positioning of a wafer and an article in an exposure apparatus for semiconductor manufacture is illustrated below. A very high precision is required for aligning a wafer and a reticle, and it is required that the positions of the wafer mark and reticle mark be found in a highly accurate fashion. Accordingly, in the third embodiment, at least one of the wafer mark and the reticle mark has mark pitches exhibiting different fundamental spatial frequencies, and the position of each mark is detected with high precision by applying the position detection method described in the first and second embodiments. More specifically, in the first and second embodiments, the positions of the reticle mark and wafer mark are obtained and their relative positions are calculated. In the third embodiment, however, a mark of a different fundamental spatial frequency is provided in one mark (e.g., the reticle mark) and it is so arranged that calculation of coarse and fine positions can be calculated by applying an orthogonal transform a single time. It should be noted that structure of the apparatus relating to positioning is similar to that of the first embodiment (see FIG. 1) and need not be illustrated or described again.

FIGS. 6A and 6B are diagrams illustrating an example of observation marks whose images are formed on the image sensing surface of the image sensing unit 6 in the third embodiment. An observation mark (wafer mark) according to the third embodiment is composed of a plurality of identically shaped patterns. As shown in FIG. 6A, the image of wafer mark WM1 is disposed on the image sensing surface with a line width and pitch that differ from those of a wafer mark WM2 on the image sensing surface. It is so arranged that pitch PW1 and pitch PW2 of the wafer marks are related by the equation PW1≠mPW2 (where m is an arbitrary integer). If calculation of mark position is performed by a method similar to that of the first embodiment using such marks, xo is decided upon by obtaining the coarse position of the wafer mark at WM1 having the coarse pitch, then, the position of WM2 having the finer pitch is calculated and xo is corrected, whereby a more accurate mark position can be obtained.

The third embodiment has been described with regard to a wafer mark. However, similar processing may be executed by disposing marks having a different mark pitch of the above kind also on the reticle side.

In each of the above embodiments, it is also possible to utilize a periodic pattern included in actual elements (actual circuit patterns) as a periodic pattern composed of a group of marks.

The main characterizing features relating to each of the foregoing embodiments may be summarized as follows:

In a mechanism that performs position detection based upon alignment marks comprising a plurality of repeating patterns, first, a signal waveform conforming to the repetition of the plurality of patterns of the alignment marks (FIGS. 3A, 3B and FIGS. 6A, 6B) is generated (image sensing unit 6, A/D converter 7 and integrating unit 8). The signal waveform generated is subjected to an orthogonal transform by the orthogonal transform unit 13 to generate a spatial frequency domain signal, and a plurality of peaks corresponding to different fundamental spatial frequencies are detected based upon peak positions in a (power) spectrum signal according to the spatial frequency domain signal (fW, fR, FIG. 4). The phase calculation unit 14 then obtains the phases regarding the fundamental spatial frequency component corresponding to each of the plurality of peaks detected, and the position calculation unit 15 calculates pattern position based upon the phases obtained.

In particular, with regard to generation of the signal waveform in the image sensing unit 6, A/D converter 7 and integrating unit 8, in the first and second embodiments, there is generated a signal waveform (FIG. 3A) that corresponds to alignment marks obtained by observing an alignment mark (RM), which is provided on the surface of a first object, and an alignment mark (WM), which is provided on the surface of a second object, in such a manner that these alignment marks combine. The position of the alignment mark provided on the surface of the first object and the position of the alignment mark provided on the surface of the second object are calculated by orthogonal transform unit 13, phase calculation unit 14 and position calculation unit 15.

It should be noted that, it is preferred that the different fundamental spatial frequencies differ from each other by an integral multiple.

Further, in the third embodiment, a coarse position of an alignment mark is obtained based upon a phase calculated with regard to a low fundamental frequency (WM1 in FIG. 6), and a fine position is calculated upon correcting the coarse position based upon a phase calculated with regard to a higher basic fundamental frequency (WM2 in FIG. 6A).

Further, in the first and second embodiments, there are supplied a first substrate (reticle R) having an alignment mark (RM) comprising a plurality of patterns that repeat at intervals PR, and a second substrate (wafer W) having an alignment mark (WM) comprising a plurality of patterns that repeat at intervals PW, where PR≠mPW holds (and m is an integer). A signal corresponding to the row of the plurality of patterns (FIG. 3B) is generated from combined alignment marks (FIG. 3A, FIG. 5) obtained by simultaneously observing the alignment marks on the first and second substrates. The generated signal is subjected to an orthogonal transform in the orthogonal transform unit 13 to obtain a spatial frequency domain signal. Two peaks (fW, fR) corresponding to the fundamental frequencies conforming to the intervals PR and PW are detected based upon peak position in this spatial frequency domain signal. The phase calculation unit 14 then obtains the phases regarding the fundamental spatial frequencies corresponding to the two peaks detected, and the position calculation unit 15 calculates the positions of the positioning patterns on the first and second substrates based upon the phases obtained.

Further, in accordance with the first embodiment, the alignment mark on the first substrate has a portion in which patterns disposed over an interval SR=nPR (where n is an integer) is located in a row of the patterns that repeat at the intervals PR, and the combined alignment marks (FIG. 3A) are such that a plurality of patterns on the second substrate are disposed between the patterns space apart by the interval SR.

Further, in accordance with the second embodiment, the alignment mark on the first substrate has a portion in which patterns are disposed over an interval SR=nPR (where n is an integer), and two of these alignment marks are provided (FIG. 5) so as to intersect orthogonally in the portion of interval SR. The alignment mark on the second substrate has a portion in which patterns are disposed over an interval SW=kPW (where k is an integer), and two of these alignment marks are provided (FIG. 5) so as to intersect orthogonally in the portion of interval SW. The combined alignment marks are such that the alignment mark on the second substrate is disposed in a space formed by the portion having the interval SR of the alignment mark on the first substrate (FIG. 5).

A process for manufacturing a semiconductor device, such as a microdevice utilizing the exposure apparatus set forth above, will now be described.

FIG. 9 is a diagram illustrating the overall flow of a process of manufacturing the semiconductor device. The circuit for the semiconductor device is designed at step S1 (circuit design). A mask is fabricated at step S2 (mask fabrication) based upon the circuit pattern designed.

Meanwhile, a wafer is manufactured using a material such as silicon at step S3 (wafer manufacture). Using the above-described mask and wafer, the above-described exposure apparatus forms the actual circuit on the wafer utilizing lithography at step S4 (wafer process), which is also referred to as "pre-treatment". A semiconductor chip is obtained, using the wafer fabricated at step S4, at step S5 (assembly), which is also referred to as "post-treatment". This step includes steps such as assembly (dicing and bonding) and packaging (chip encapsulation). The semiconductor device fabricated at step S5 is subjected to inspections such as an operation verification test and a durability test at step S6 (inspection). The semiconductor device is completed through these steps and then is shipped at step S7.

The wafer process of step 4 above has the following steps including an oxidizing step of oxidizing the surface of the wafer, a CVD step of forming an insulating film on the wafer surface, an electrode forming step of electrodes on the wafer by vapor deposition, an ion implantation step of implanting ions in the wafer, a resist treatment step of coating the wafer with a photoresist, an exposure step of transferring the circuit pattern to the wafer by the above-described exposure apparatus after the resist treatment step, a developing step of developing the wafer exposed at the exposure step, an etching step of etching away portions other than the photoresist developed at the developing step, and a resist removing step of removing unnecessary resist left after etching is performed. Multiple circuit patterns are formed on the wafer by implementing these steps repeatedly.

In accordance with the present invention, as described above, it is possible to raise the speed mark position detection that uses an orthogonal transform.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2003-029674 filed on Feb. 6, 2003, which is hereby incorporated by reference herein.

The invention claimed is:

1. A position detecting method comprising steps of:
sensing an image of first and second marks;
orthogonally transforming a signal obtained in said sensing step; and
calculating each position of the first and second marks based on a phase of a corresponding frequency component obtained in said transforming step,
wherein patterns are disposed at a first interval in the first mark, patterns are disposed at a second interval in the second mark, and one of the first and second intervals is not an integer multiple of the other of the first and second intervals.

2. A position detecting method comprising steps of:
sensing an image of first and second marks;
orthogonally transforming a signal obtained in said sensing step; and
calculating each position of the first and second marks based on a phase of a corresponding frequency component obtained in said transforming step,
wherein the first mark includes two groups of patterns, in each of the two groups patterns are disposed at an interval A, the two groups are disposed at an interval nA, where n is an integer, and the second mark falls within the interval nA in the signal.

3. A position detecting apparatus comprising:
a sensing unit which senses an image of first and second marks;
a transform unit which orthogonally transforms a signal obtained by said sensing unit; and
a calculation unit which calculates each position of the first and second marks based on a phase of a corresponding frequency component obtained by said transform unit,
wherein patterns are disposed at a first interval in the first mark, patterns are disposed at a second interval in the second mark, and one of the first and second intervals is not an integer multiple of the other of the first and second intervals.

4. An exposure apparatus for exposing a substrate to a pattern, said apparatus comprising:
a position detecting apparatus as defined in claim 3.

5. A device manufacturing method comprising:
a step of exposing a substrate to a pattern using an exposure apparatus as defined in claim 4.

6. A position detecting apparatus comprising:
a sensing unit which senses an image of first and second marks;
a transform unit which orthogonally transforms a signal obtained by said sensing unit; and
a calculation unit which calculates each position of the first and second marks based on a phase of a corresponding frequency component obtained by said transform unit,
wherein the first mark includes two groups of patterns, in each of the two groups patterns are disposed at an interval A, the two groups are disposed at an interval nA, where n is an integer, and the second mark falls within the interval nA in the signal.

7. An exposure apparatus for exposing a substrate to a pattern, said apparatus comprising:
a position detecting apparatus as defined in claim 6.

8. A device manufacturing method comprising:
a step of exposing a substrate to a pattern using an exposure apparatus as defined in claim 7.

* * * * *